US012805236B2

(12) United States Patent
Kim et al.

(10) Patent No.: US 12,805,236 B2
(45) Date of Patent: Nov. 17, 2026

(54) VALVE CONTROL DEVICE AND SUBSTRATE PROCESSING APPARATUS INCLUDING THE SAME

(71) Applicant: SEMES CO., LTD., Chungcheongnam-do (KR)

(72) Inventors: Eunseok Kim, Cheonan-si (KR); Kibong Kim, Paju-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 397 days.

(21) Appl. No.: 18/399,894

(22) Filed: Dec. 29, 2023

(65) Prior Publication Data

US 2024/0222150 A1 Jul. 4, 2024

(30) Foreign Application Priority Data

Dec. 30, 2022 (KR) ........................ 10-2022-0190971

(51) Int. Cl.
*H10P 72/00* (2026.01)
*G05D 7/06* (2006.01)

(52) U.S. Cl.
CPC ....... *H10P 72/0402* (2026.01); *G05D 7/0652* (2013.01)

(58) Field of Classification Search
CPC .......................... H10P 72/0402; G05D 7/0652
USPC .......................................................... 118/715
See application file for complete search history.

(56) References Cited

U.S. PATENT DOCUMENTS

| | | | | |
|---|---|---|---|---|
| 11,094,564 | B2 | 8/2021 | Iwahata | |
| 11,655,907 | B2 | 5/2023 | Choi | |
| 2016/0211158 | A1 | 7/2016 | Yeow | |
| 2016/0362784 | A1* | 12/2016 | Isobe | C23C 16/4405 |
| 2018/0179628 | A1* | 6/2018 | Hashimoto | C23C 16/4412 |
| 2019/0019673 | A1* | 1/2019 | Ogawa | C23C 16/32 |
| 2021/0111004 | A1* | 4/2021 | Sawachi | H01J 37/32091 |

FOREIGN PATENT DOCUMENTS

| | | | |
|---|---|---|---|
| JP | 2020-085086 | A | 6/2020 |
| KR | 10-2019-0046691 | A | 5/2019 |
| KR | 10-2020-0038390 | A | 4/2020 |
| KR | 10-2306465 | B1 | 9/2021 |
| KR | 10-2390259 | B1 | 4/2022 |

OTHER PUBLICATIONS

Office Action issued in corresponding KR Patent Application No. 10-2022-0190971, dated Apr. 23, 2024, pp. 1-9.

* cited by examiner

*Primary Examiner* — Charlee J. C. Bennett
(74) *Attorney, Agent, or Firm* — Carter, DeLuca & Farrell LLP

(57) ABSTRACT

A valve control device includes a plurality of valves respectively installed on a plurality of first pipes through which a supply fluid flows and configured to control opening and closing of the plurality of first pipes, a manifold including a second pipe connected to each of the plurality of valves and supplying a control gas to the plurality of valves, and a flow rate controller installed on the second pipe to adjust a flow rate of the control gas flowing through the second pipe, wherein the plurality of valves include at least one of a normal open (NO) type valve and a normal close (NC) valve.

20 Claims, 11 Drawing Sheets

VALVE CONTROL DEVICE AND SUBSTRATE PROCESSING APPARATUS INCLUDING THE SAME

CROSS-REFERENCE TO RELATED APPLICATION

This application is based on and claims priority under 35 U.S.C. § 119 to Korean Patent Application No. 10-2022-0190971, filed on Dec. 30, 2022, in the Korean Intellectual Property Office, the disclosure of which is incorporated by reference herein in its entirety.

BACKGROUND

1. Field

The inventive concept relates to a valve control device and a substrate processing apparatus including the valve control device

2. Description of the Related Art

In order to manufacture semiconductor devices, various processes, such as oxidation processes, photolithography, etching, thin film deposition, metallization, electrical die sorting (EDS), and packaging, are performed on a wafer. As semiconductor devices are increasingly miniaturized, the need for high-precision control of semiconductor process conditions has gradually increased. In particular, in a thin film deposition process, uniform thickness of a deposition layer through high-precision control of a process fluid is a key element of a semiconductor device.

SUMMARY

The inventive concept provides a valve control device for adjusting driving pressure applied to a valve, and a substrate processing apparatus including the valve control device.

The inventive concept provides a valve control device that prevents breakage of a valve and extends the life of the valve, and a substrate processing apparatus including the valve control device.

In addition, the technical goals to be achieved by the inventive concept are not limited to the technical goals mentioned above, and other technical goals may be clearly understood by one of ordinary skill in the art from the following descriptions.

Additional aspects will be set forth in part in the description which follows and, in part, will be apparent from the description, or may be learned by practice of the presented embodiments of the disclosure.

According to an aspect of the inventive concept, there is provided a valve control device including: a plurality of valves respectively installed on a plurality of first pipes through which a supply fluid flows and configured to control opening and closing of the plurality of first pipes; a manifold including a plurality of second pipes respectively connected to the plurality of valves and supplying a control gas to the plurality of valves; and a flow rate controller installed on at least one of the second pipes and configured to adjust a flow rate of the control gas flowing through the installed second pipe, wherein the plurality of valves include at least one of a normal open (NO) type valve and a normal close (NC) valve.

The flow rate controller may have a one-to-one correspondence to the plurality of valves.

The plurality of flow rate controllers may be installed on the second pipes to which the NO type valve is connected.

The plurality of valves may include at least one NO type valve, and among the plurality of second pipes, a second pipe on which the flow rate controller is installed may be connected to the NO type valve.

The plurality of valves may include a first valve group, the first valve group may include NO type valves or NC type valves, and flow rates of the supply fluid flowing through the plurality of first pipes on which the first valve group is installed may be the same.

The first valve group may be connected to a pipe branched from one end of the second pipe.

The flow rate controller may be installed on at least two second pipes, and the flow rate controller may be further configured to adjust flow rates of a control gas flowing through the at least two second pipes, in which the flow rate controller is installed, to be different from each other.

The plurality of valves may include a second valve group including two or more NO type valves, and, as a flow rate of the supply fluid flowing through a plurality of first pipes on which the second valve group is installed increases, a flow rate of the control gas flowing through the second pipe connected to the second valve group may increase.

The plurality of valves may include a third valve group including two or more NC type valves, and, as a flow rate of the supply fluid flowing through a plurality of first pipes on which the third valve group is installed increases, a flow rate of the control gas flowing through the second pipe connected to the third valve group may decrease.

The plurality of valves may include at least one NO type valve and at least one NC type valve, a flow rate of the control gas flowing through the second pipe connected to the at least one NO type valve may be a first flow rate, a flow rate of the control gas flowing through the second pipe connected to the at least one NC type valve may be a second flow rate, and the first flow rate may be less than the second flow rate.

The plurality of valves may include a diaphragm valve.

The valve control device may further include a third pipe through which the control gas flows into the manifold; and a first flow rate controller installed on the third pipe.

According to an aspect of the inventive concept, there is provided a valve control device including: a plurality of valves respectively installed on a plurality of first pipes through which a supply fluid flows and configured to control opening and closing of the plurality of first pipes; a manifold including a plurality of second pipes respectively connected to the plurality of valves and supplying a control gas to the plurality of valves; a flow rate controller installed at least one of the second pipes and configured to adjust a flow rate of the control gas flowing through the installed second pipes; a first measuring device installed on at least one of the second pipes and configured to measure a flow rate of the control gas flowing through the installed second pipe; and a controller connected to the flow rate controller and configured to adjust a target flow rate of the flow rate controller, wherein the plurality of valves include at least one of a normal open (NO) type valve and a normal close (NC) valve.

The plurality of valves may include a fourth valve group, and the fourth valve group includes a valve connected to a second pipe on which the first measuring device is installed.

The valve control device may further include a first system configured to receive data from the first measuring device, wherein the first system may be further configured to determine whether a valve included in the fourth valve group is abnormal.

The valve control device may further include a second measuring device located in each of a plurality of first pipes on which the fourth valve group is installed and configured to measure the flow rate of the supply fluid flowing through the plurality of first pipes.

The plurality of valves may include a fifth valve group, and the fifth valve group may include valves installed on the plurality of first pipes where the second measuring device is located.

According to an aspect of the inventive concept, there is provided a substrate processing apparatus including: a chamber; a fluid supply configured to provide supercritical fluid into the chamber; a first pipe connecting the fluid supply to the chamber to provide a path for the supercritical fluid; a third pipe connected to the chamber to discharge the supercritical fluid to the outside of the chamber; and a valve control device connected to at least one of the first pipe and the third pipe and configured to control opening and closing of an installed pipe, wherein the valve control device includes: a plurality of valves installed on at least one of the first pipe and the third pipe and configured to open and close an installed pipe; a manifold including a plurality of second pipes respectively connected to the plurality of valves and supplying a control gas to the plurality of valves; and a flow rate controller installed on at least one of the second pipes and configured to adjust a flow rate of the control gas flowing through the installed second pipe, wherein the plurality of valves include at least one of a normal open (NO) type valve and a normal close (NC) valve.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
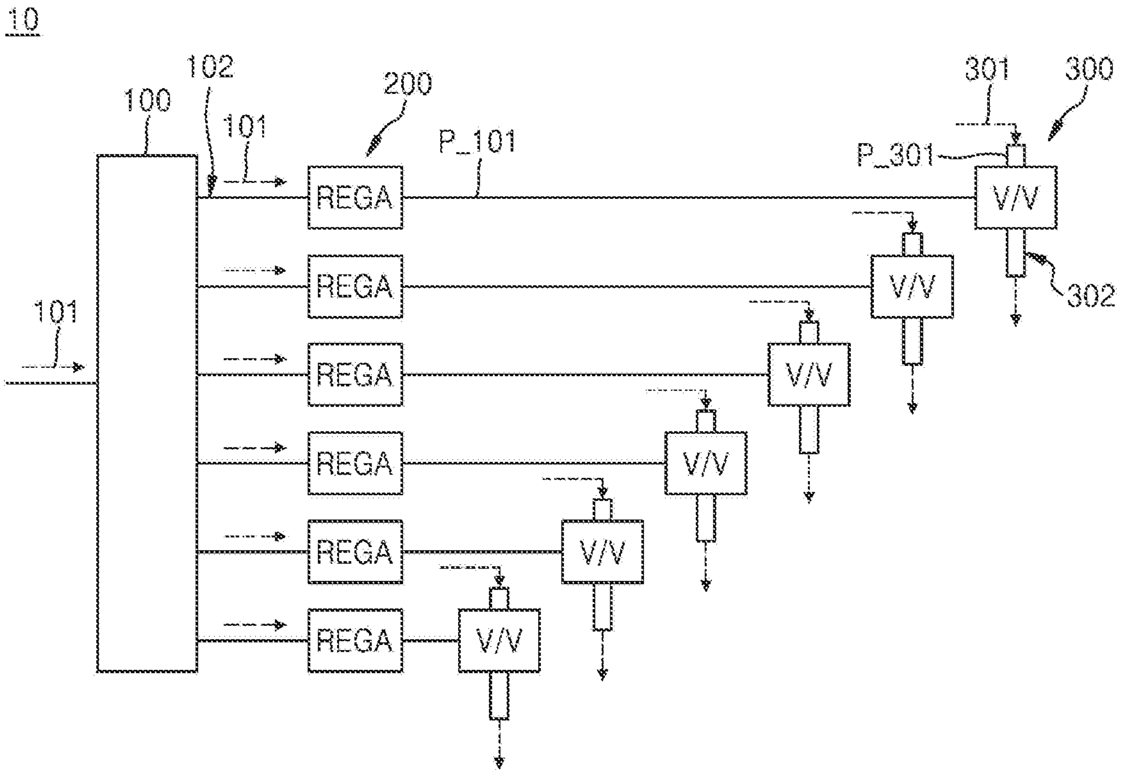
FIG. 1 is a conceptual diagram schematically illustrating a valve control device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Figure 2:
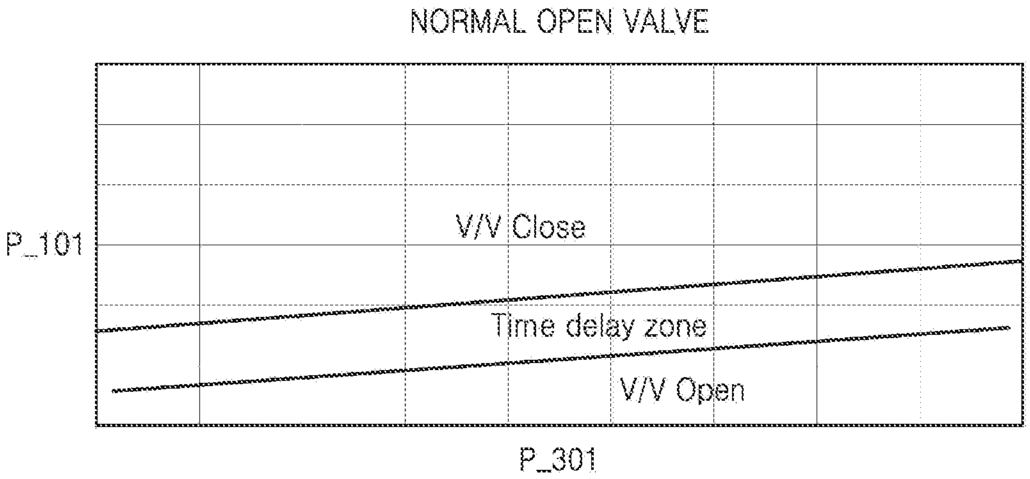
FIG. 2 is a graph showing the pressure of a removal gas according to the pressure of a supply fluid of a normal open valve of valves in FIG. 1.
Figure 3:
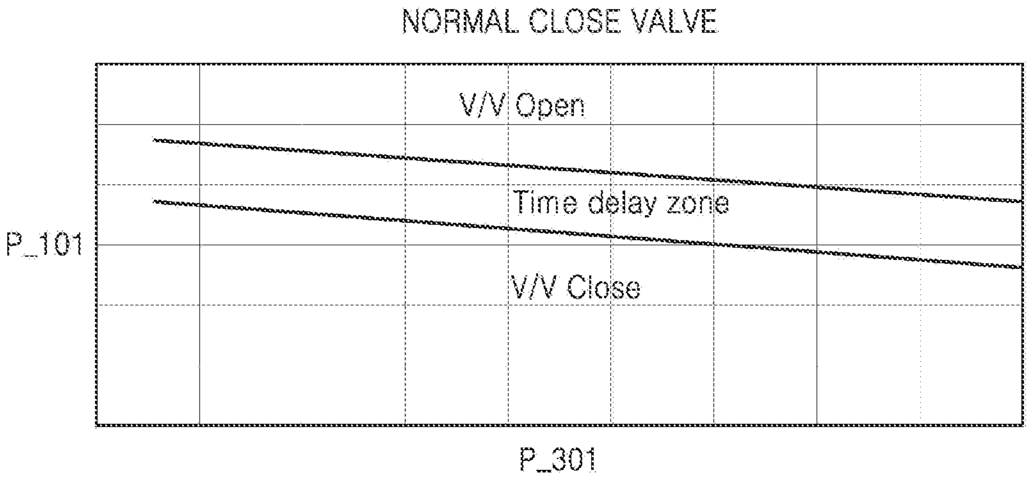
FIG. 3 is a graph showing the pressure of a removal gas according to the pressure of a supply fluid of a normal close valve among valves in FIG. 1.

FIG. 1 is a conceptual diagram schematically illustrating a valve control device according to an embodiment. FIG. 2 is a graph showing the pressure of a removal gas according to the pressure of a supply fluid of a normal open valve among valves in FIG. 1. FIG. 3 is a graph showing the pressure of a removal gas according to the pressure of a supply fluid of a normal close valve among the valves in FIG. 1.

Hereinafter, a normal open (NO) type valve is in an open state, in which a supply fluid 301 is supplied, in a basic state before a control gas 101 flows into a valve, and is in a closed state, in which the supply of the supply fluid 301 is blocked, when the control gas 101 flows into the valve.

A normal close (NC) type valve is in a closed state, in which the supply of the supply fluid 301 is blocked, in the basic state, and is in an open state, in which the supply fluid 301 is supplied, while the control gas 101 flows into the valve.

Referring to FIGS. 1 to 3, a valve control device 10 may include a manifold 100, a plurality of valves 300, and a plurality of flow rate controllers 200.

The manifold 100 of the valve control device 10 may supply the control gas 101 to the plurality of valves 300. In other words, the control gas 101 may flow into the plurality of valves 300 through the manifold 100. The manifold 100 may include a plurality of second pipes 102. The plurality of second pipes 102 may be connected to the plurality of valves 300 respectively. The plurality of second pipes 102 may supply the control gas 101 to the plurality of valves 300, respectively. That is, the plurality of second pipes 102 may be connected to the plurality of valves 300 to provide paths through which the control gas 101 is supplied to the plurality of valves 300.

In some embodiments, the control gas 101 supplied to the plurality of valves 300 through the manifold 100 may pressurize a piston of each of the valves 300. The control gas 101 may pressurize the piston of the valve 300 to control opening and closing of a first pipe 302 on which the valve 300 is installed.

That is, in the case of the NO type valve, the piston may move downward by the control gas 101 and thus the supply of the supply fluid 301 may be blocked. In the case of the NC type valve, the piston may move upward by the control gas 101 and thus the supply fluid 301 may be supplied.

The plurality of valves 300 of the valve control device 10 may be respectively installed on a plurality of first pipes 302 and may control opening and closing of the first pipes 302. The first pipes 302 are pipe through which the supply fluid 301 flows. That is, the plurality of valves 300 may be respectively installed on the first pipes 302, through which the supply fluid 301 flows, to open and close the first pipes 302.

The second pipes 102 may be connected to the plurality of valves 300, respectively. That is, the second pipes 102 may be connected to the insides of the valves 300. Specifically, each of the plurality of valves 300 may include a piston, and the second pipes 102 may be respectively connected to the valves 300 so that the control gas 101 applies pressure to the piston.

The plurality of valves 300 may be respectively installed on the plurality of first pipes 302. Each of the plurality of valves 300 may control the supply of the supply fluid 301 flowing through a first pipe 302 connected thereto. In other words, each of the plurality of valves 300 may open or close the first pipe 302 to supply or block the supply fluid 301.

In some embodiments, the plurality of valves 300 may include diaphragm valves, globe valves, or gate valves. However, the inventive concept is not limited thereto, and the plurality of valves 300 may be valves that control opening and closing of a flow path.

Specifically, an opening and closing method of the first pipe 302 of the valve 300 will be described using a diaphragm valve as an example. The first pipe 302 may located on both sides of the diaphragm valve, and thus, the supply fluid 301 may pass through the diaphragm valve.

The diaphragm valve may include a piston and a diaphragm, and may move according to the movement of the piston.

In some embodiments, in the case of a NO type diaphragm valve, as the piston moves downward by the control gas 101, the diaphragm may close the first pipe 302. That is, in the case of the NO type diaphragm valve, the control gas 101 may apply pressure to the diaphragm, and thus, the diaphragm may block the path of the supply fluid 301 inside the first pipe 302. In this case, the pressure applied to the diaphragm by the control gas 101 may cause breakage and defects of the diaphragm.

In some embodiments, in the case of a NC type diaphragm valve, the first pipe 302 may be opened as the piston moves upward by the control gas 101. That is, in the case of the NC type diaphragm valve, the control gas 101 may apply pressure to the diaphragm to thereby provide a flow path for a supply fluid. In this case, as a driving pressure is removed and the diaphragm moves downward by an elastic body, breakage and defects of the diaphragm may occur.

The plurality of valves 300 may control opening and closing of the first pipes 302 by the control gas 101. In some embodiments, the control gas 101 may flow into the plurality of valves 300 and close the first pipes 302 as portions of the valves 300 move. In other words, the control gas 101 may generate driving pressure inside the valve 300 to close the valve 302 and block the supply of the supply fluid 301.

The plurality of valves 300 may include at least one of the NO type valve and the NC type valve. That is, the plurality of second pipes 102 may be connected to a plurality of valves 300 of different types. In other words, a plurality of valves 300 having different types of basic conditions may be connected to one manifold 100. In addition, all of the plurality of valves 300 may be NO type valves or NC type valves.

The flow rate controller 200 of the valve control device 10 may be installed on the second pipe 102. The flow rate controller 200 may adjust the flow rate of the control gas 101. That is, the flow rate controller 200 may adjust the flow rate of the control gas 101 flowing through the second pipe 102 connected thereto. In other words, the flow rates of the control gas 101 flowing through the plurality of second pipes 102 may be different from each other by the flow rate controller 200.

In some embodiments, the flow rate controller 200 may be installed on at least two second pipes 102. The flow rate controller 200 may vary the flow rate of the control gas 101 flowing through the second pipe 102 on which the flow rate controller 200 is installed. That is, the flow rate controller 200 may differently control the flow rate of the control gas 101 flowing into the plurality of valves 300.

The valve control device 10 according to an embodiment may individually control the plurality of valves 300 connected to the second pipes 102 through the flow rate controller 200. A typical valve control device controls the plurality of valves 300 connected to the manifold 100 to the same driving pressure through one flow rate controller. The valve control device 10 according to an embodiment may control the driving pressures of the plurality of valves 300 with respective flow rate controllers 200.

In some embodiments, the plurality of valves 300 may have a one-to-one correspondence to the plurality of flow rate controllers 200. In other words, one flow rate controller 200 may be connected to each valve 300. That is, the number of valves 300 and the number of flow rate controllers 200 may be the same. The plurality of flow rate controllers 200 may be respectively connected to the plurality of valves 300 and provide different control gas flow rates P_101 to the plurality of valves 300. That is, in the valve control device 10, as the plurality of flow rate controllers 200 and the plurality of valves 30 may have a one-to-one correspondence to each other, different control gas flow rates P_101 may be provided to the plurality of valves 300, respectively. That is, the flow rate controllers 200 respectively connected to the valves 300 may provide different driving pressures according to the pressure P_301 of a supply fluid passing through the valves 300.

In some embodiments, the plurality of valves 300 may include at least one NO type valve and at least one NC type valve. A flow rate of the control gas 101 flowing through a second pipe 102 connected to the NO type valve may be a first flow rate. A flow rate of the control gas 101 flowing through a second pipe 102 connected to the NC type valve may be a second flow rate. The first flow rate may be less than the second flow rate.

In other words, a flow rate of the control gas 101 flowing through a second pipe 102 connected to the NC type valve may be greater than a flow rate of the control gas 101 flowing through a second pipe 102 connected to the NO type valve.

For example, when the pressure of a first pipe 302 on which the NO type valve is installed and the pressure of a first pipe 302 on which the NC type valve is installed are the same, the second flow rate may be greater than the first flow rate.

A typical valve control device may control the valves 300 at a constant driving pressure regardless of the pressure P_301 of a supply fluid passing through the valves 300. The valve control device 10 according to an embodiment may control the valves 300 with different driving pressures according to the pressure P_301 of a supply fluid passing through the valves 300. Accordingly, the valve control device 10 according to an embodiment may include an NO type valve and an NC type valve, and may adjust the pressure of the control gas 101 differently for each type of valve.

Referring to FIG. 2, in the NO type valve, the flow rate P_101 of a control gas for opening and closing the first pipe 302 may vary according to the pressure P_301 of a supply fluid. Specifically, as the pressure P_301 of the supply fluid increases, the flow rate P_101 of the control gas flowing into the valve 300 may increase. As the flow rate P_101 of the control gas increases, the driving pressure of the valve 300 may increase. That is, as the pressure P_301 of the supply fluid increases, the flow rate controller 200 may adjust to increase the driving pressure of the valve 300. For example, the flow rate controller 200 may adjust the flow rate P_101 of the control gas to increase as the pressure P_301 of the supply fluid passing through the NO type valve increases.

In some embodiments, the plurality of valves 200 may include a second valve group. The second valve group may include two or more NO type valves. As the flow rate of the supply fluid 301 flowing through a first pipe 302 on which the second valve group is installed increases, the flow rate of the control gas 101 flowing through a second pipe 102 connected to the second valve group may increase. That is, in the case of the NO type valve, as the flow rate of the supply fluid 301 passing through the valve 300 increases, the flow rate of the control fluid 101 flowing into the valve 300 may increase.

Referring to FIG. 3, in the NC type valve, the driving pressure of a valve for opening and closing the first pipe 302 may vary according to the pressure P_301 of a supply fluid. Specifically, as the pressure P_301 of the supply fluid increases, the flow rate P_101 of a control gas flowing into the valve 300 may decrease. As the flow rate of the control gas 101 decreases, the driving pressure of the valve 300 may decrease. That is, as the pressure P_301 of the supply fluid increases, the flow rate controller 200 may control the driving pressure of the valve 300 to decrease. For example, the flow rate controller 200 may adjust the flow rate P_101 of the control gas to decrease as the pressure P_301 of the supply fluid passing through the NC type valve increases.

In some embodiments, the plurality of valves 200 may include a third valve group. The third valve group may include two or more NC type valves. As the flow rate of the supply fluid 301 flowing through a first pipe 302 on which the third valve group is installed increases, the flow rate of the control gas 101 flowing through a second pipe 102 connected to the third valve group may decrease. That is, in the case of the NC type valve, as the flow rate of the supply fluid 301 passing through the valve 300 increases, the flow rate of the control gas 101 flowing into the valve 300 may decrease.

A typical valve control device may provide a constant driving pressure to the plurality of valves 300 regardless of the pressure P_301 of the supply fluid. The valve control device 10 according to an embodiment may control the valves 300 with different driving pressures according to the pressure P_301 of the supply fluid passing through the valves 300. The valve control device 10 may provide a driving pressure of the valve 300 for each pressure of the supply fluid P_301, thereby providing the valve 300 with an optimized driving pressure for opening and closing the first pipe 302. That is, the valve control device 10 may control the valve 300 with an appropriate driving pressure for opening and closing the first pipe 302, and thus, the life of the valve 300 may be extended.

In some embodiments, the plurality of valves 300 and the plurality of flow rate controllers 200 may have a one-to-one correspondence to each other. In other words, one flow rate controller 200 may be connected to each valve 300. That is, the number of valves 300 and the number of flow rate controllers 200 may be the same. The plurality of flow rate controllers 200 may be respectively connected to the plurality of valves 300 and provide different control gas flow rates P_101 to the plurality of valves 300. That is, in the valve control device 10, as the plurality of flow rate controllers 200 and the plurality of valves 300 have a one-to-one correspondence to each other, different control gas flow rates P_101 may be provided to the plurality of valves 300, respectively. That is, the flow rate controllers 200 respectively connected to the valves 300 may provide different driving pressures according to the pressure P_301 of a supply fluid passing through the valves 300.

Figure 4:
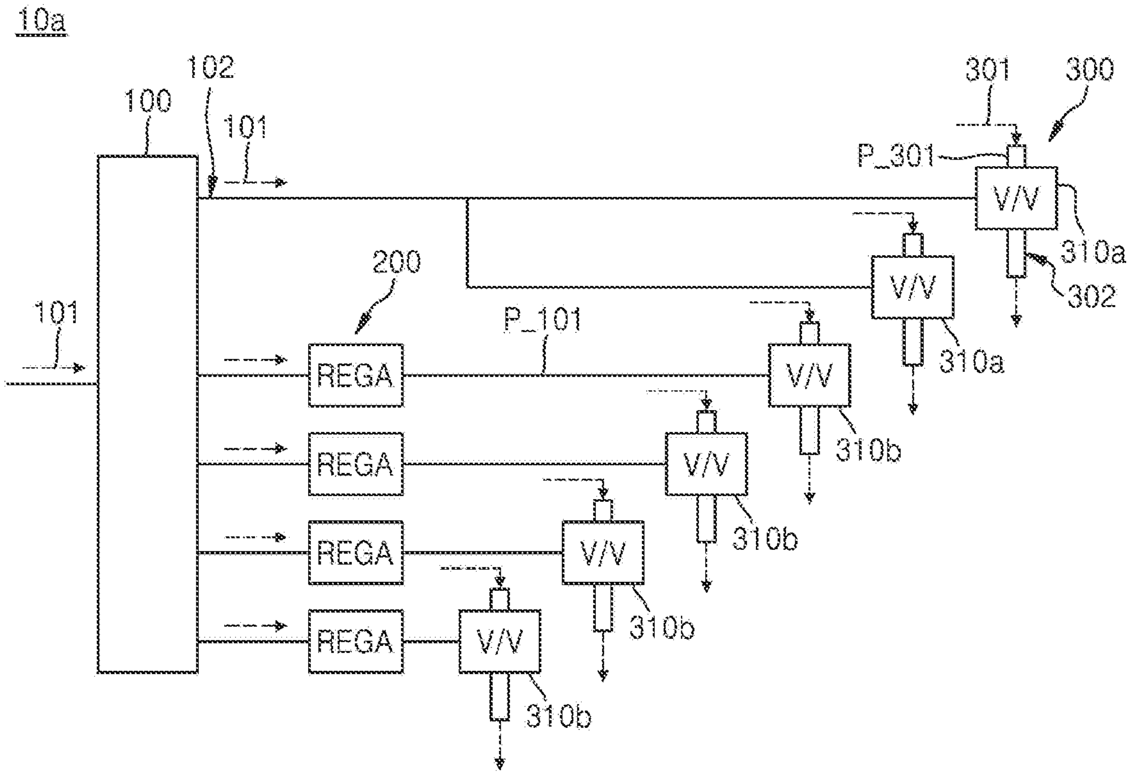
FIG. 4 is a conceptual diagram schematically illustrating a valve control device according to an embodiment.

FIG. 4 is a conceptual diagram schematically illustrating a valve control device according to an embodiment.

Referring to FIG. 4, a valve control device 10*a* may include a manifold 100, a plurality of flow rate controllers 200, and a plurality of valves 300.

Hereinafter, descriptions of the valve control device 10*a* that are redundant with those of the valve control device 10 of FIG. 1 will be omitted and differences will be described.

Each of the plurality of flow rate controllers 200 of the valve control device 10*a* may be connected to a second pipe 102 connected to an NO type valve 310*b*. In other words, each of the plurality of flow rate controllers 200 may not be connected to a second pipe 102 connected to an NC type valve 310*a*.

Specifically, the valve control device 10*a* may include an NO type valve 310*b* and an NC type valve 310*a*. The NO type valve 310*b* and the NC type valve 310*a* may be installed on different second pipes 102. The flow rate controller 200 may be installed on the second pipe 102 on which the NO type valve 310*b* among the plurality of valves 300 is installed. That is, the flow rate controller 200 may adjust a flow rate P_101 of a control gas 101 flowing into the NO type valve 310*b*.

In other words, the valve control device 10*a* may extend the life of the NO type valve 310*b* by adjusting the control gas 101 according to the driving pressure of the NO type valve 310*b*. In the process of closing the first pipe 302, the NO type valve 310*a* is driven by pressure generated by a control gas. The flow rate controller 200 may suppress breakage and defects of the valve 300 that occur when the NO type valve 310*a* closes the first pipe 302.

In the valve control device 10*a* according to an embodiment, the number of flow rate controllers 200 may be different from the number of valves 300. In some embodiments, the flow rate controller 200 is connected to the NO type valve 310*a* and is not connected to the NC type valve 310*a*, and thus, cost may be reduced.

Figure 5:
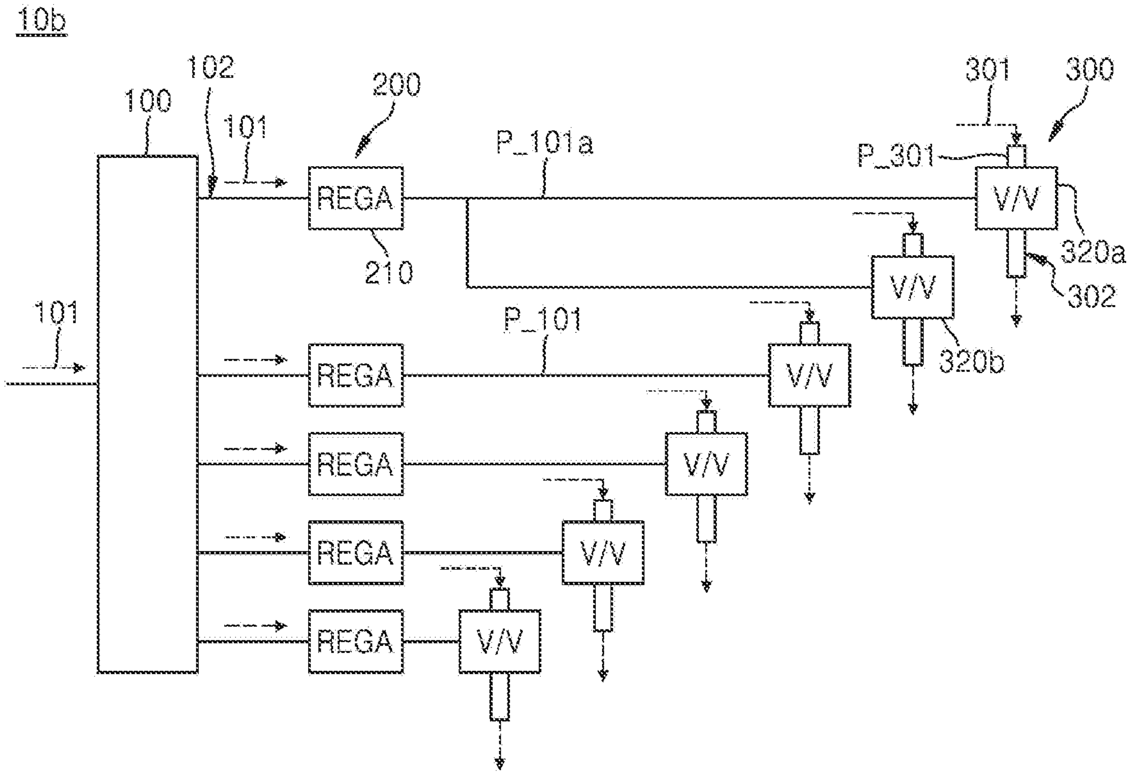
FIG. 5 is a conceptual diagram schematically illustrating a valve control device according to an embodiment.

FIG. 5 is a conceptual diagram schematically illustrating a valve control device according to an embodiment.

Referring to FIG. 5, a valve control device 10*b* may include a manifold 100, a plurality of flow rate controllers 200, and a plurality of valves 300.

Hereinafter, descriptions of the valve control device 10*b* that are redundant with those of the valve control device 10 of FIG. 1 will be omitted and differences will be described.

Pressures P_301 of a supply fluid passing through the plurality of valves 300 of the valve control device 10*b* may be different from each other. That is, the pressure P_301 of a supply fluid flowing through a first pipe 302 may vary for each valve 300.

In some embodiments, the plurality of valves 300 may include first valve groups 320*a* and 320*b*. The first valve groups 320*a* and 320*b* may include an NO type valves or NC type valves. That is, the first valve groups 320*a* and 320*b* may include valves of the same type. Flow rates of a supply fluid 301 flowing through first pipes 302 on which the first valve groups 320*a* and 320*b* are installed may be the same. That is, the flow rates of the supply fluid 301 passing through the first valve groups 320*a* and 320*b* may be substantially the same.

Specifically, the first valve groups 320*a* and 320*b* may include a first valve 320*a* and a second valve 320*b*. A pressure P_301 of a supply fluid passing through the first valve 320*a* and a pressure P_301 of a supply fluid passing through the second valve 320*b* may be substantially the same.

Driving pressures for opening and closing the first pipes 302 on which the first valve groups 320*a* and 320*b* are installed may be the same. That is, the driving pressures of the first valve 320*a* and the second valve 320*b* having the same supply fluid pressure P_302 may be substantially the same.

In some embodiments, the first valve groups 320*a* and 320*b* may be respectively connected to pipes branched from one end of the second pipe 102. That is, the first valve groups 320*a* and 320*b* may be respectively connected to branched pipes of the second pipe 102. One flow rate controller 210 may be installed on the second pipe 102 on which the first valve groups 320*a* and 320*b* are installed. That is, because the first valve groups 320*a* and 320*b* are installed on the same second pipe 102, flow rates of a control gas 101 flowing into valves of the first valve groups 320*a* and 320*b* may be the same.

In other words, the first valve 320*a* and the second valve 320*b* having the same supply fluid pressure P_301 may be connected to one flow rate controller 210. That is, one flow rate controller 210 may adjust the flow rate of the control gas 101 flowing through the second pipe 101 connected to the first valve groups 320*a* and 320*b*. That is, one flow rate controller 210 may adjust the flow rate of the control gas 101 flowing into the first valve 320*a* and the second valve 320*b*.

The valve control device 10*b* according to an embodiment may control some of the plurality of valves 300 with one flow rate controller 210, thereby reducing the cost of installing the valve control device 10*b* and reducing the cost of maintenance.

Figure 6:
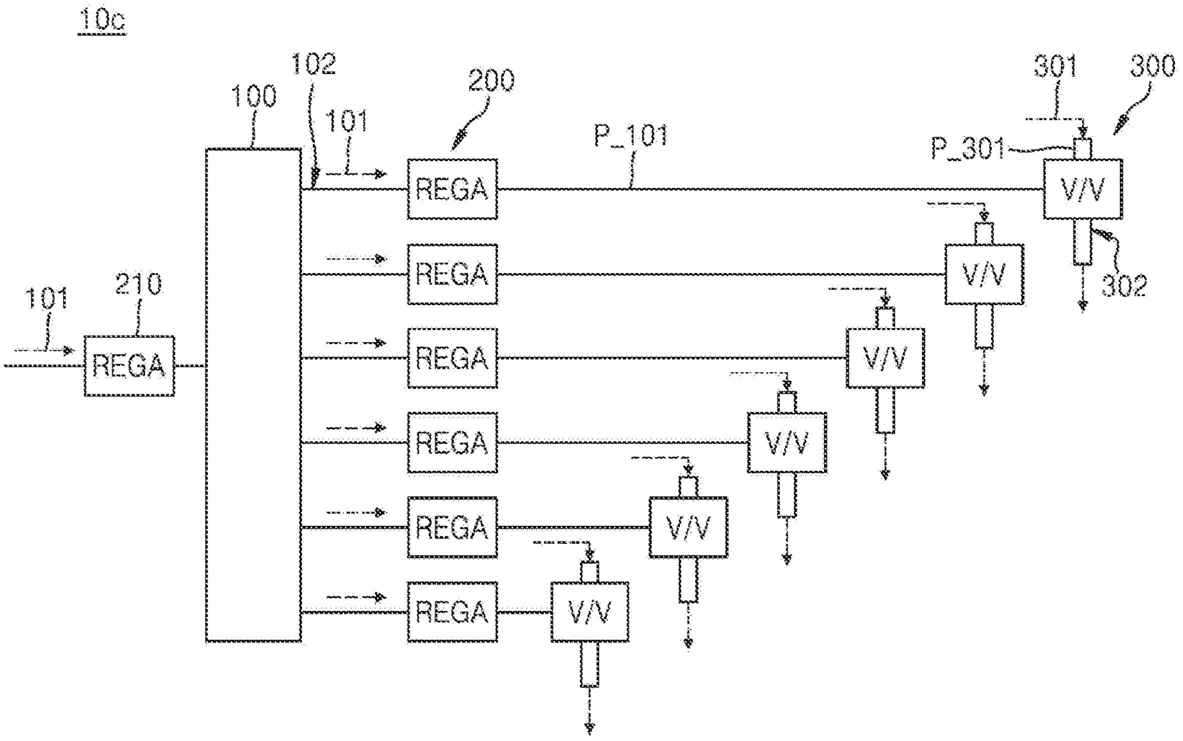
FIG. 6 is a conceptual diagram schematically illustrating a valve control device according to an embodiment.

FIG. 6 is a conceptual diagram schematically illustrating a valve control device according to an embodiment.

Referring to FIG. 6, a valve control device 10*c* may include a manifold 100, a plurality of flow rate controllers 200, and a plurality of valves 300.

Hereinafter, descriptions of the valve control device 10*c* that are redundant with those of the valve control device 10 of FIG. 1 will be omitted and differences will be described.

The valve control device 10*c* may further include a third pipe 120 and a first flow rate controller 220.

The third pipe 120 may be a flow path through which a control gas flows into the manifold 100. In other words, the third pipe 120 may provide a path for injecting a control gas 101 into the manifold 100.

The first flow rate controller 220 may be installed on the third pipe 120. That is, the first flow rate controller 220 may be installed on the third pipe 120 to adjust the flow rate of the control gas 101 flowing into the manifold 100. In other words, the first flow rate controller 220 may adjust the total flow rate of the control gas 101 flowing into the plurality of valves 300.

The valve control device 10*c* according to an embodiment may adjust the flow rate of the control gas 101 flowing into the manifold 100, and thus may adjust the total flow rate of the control gas 101 flowing out to the second pipe 102. In some embodiments, when the valve control device 10*c* includes a plurality of manifolds 100, the total amount of the control gas 101 flowing into each of the manifolds 100 may be adjusted.

Figure 7:
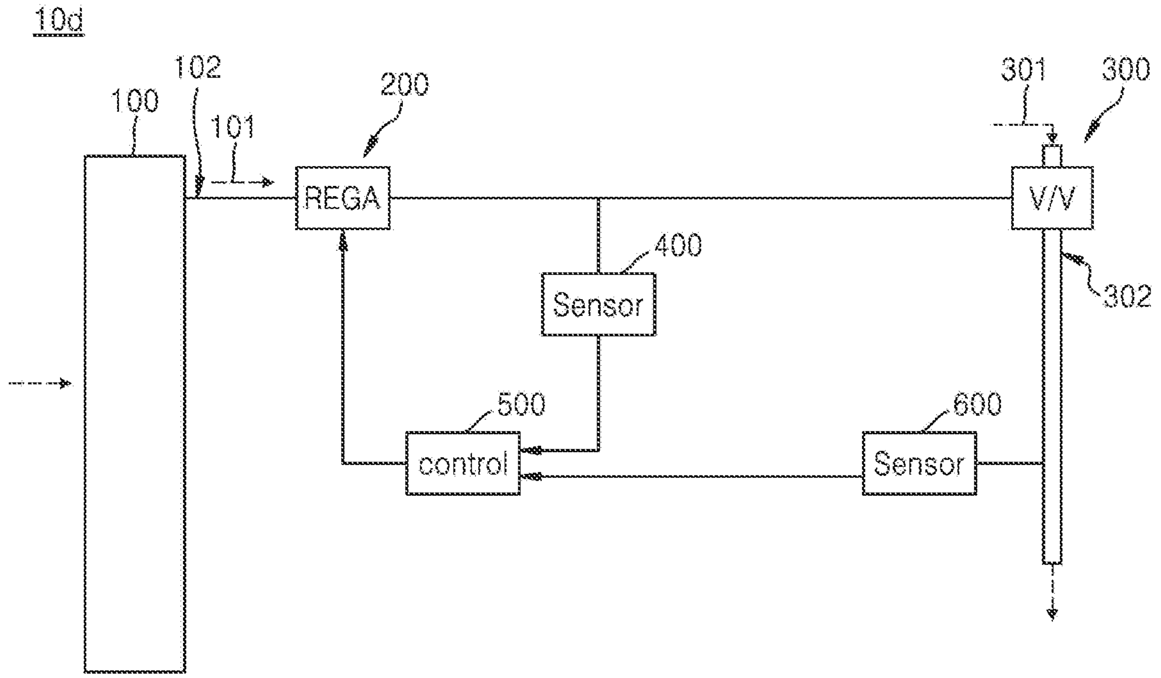
FIG. 7 is a conceptual diagram schematically illustrating a valve control device according to an embodiment.

FIG. 7 is a conceptual diagram schematically illustrating a valve control device according to an embodiment.

Referring to FIG. 7, a valve control device 10*d* may include a manifold 100, a plurality of valves 300, a plurality of flow rate controllers 200, a first measuring device 400, a second measuring device 600, and a controller 500.

Hereinafter, descriptions of the valve control device 10*d* that are redundant with those of the valve control device 10 of FIG. 1 will be omitted and differences will be described.

The first measuring device 400 of the valve control device 10*d* may be connected to a second pipe 102. In some embodiments, the first measuring device 400 may be connected to the second pipe 102 passing through a flow rate controller 200. In other words, the first measuring device 400 may measure the flow rate of the control gas 101 before being introduced into a valve 300 after passing through a flow rate controller 200.

The first measuring device 400 may measure the flow rate of a control gas flowing into the plurality of valves 300. In other words, the first measuring device 400 may measure the flow rate of the control gas 101 passing through the flow rate controller 200.

In some embodiments, the first measuring device 400 may measure the flow rate of the control gas 101 by measuring the pressure of the control gas 101 flowing through the second pipe 102. In some embodiments, the first measuring device 400 may measure the flow rate of the control gas 101 by measuring the flow velocity of the control gas 101 flowing through the second pipe 102.

The second measuring device 600 of the valve control device 10*d* may measure the flow rate of the supply fluid 301 passing through the valve 300 and flowing through the first pipe 302. In other words, the second measuring device 600 may measure the pressure of the supply fluid 301 passing through the valve 300.

Specifically, the second measuring device 600 may be installed on the first pipe 302 on which the valve 300, to which the second pipe 102 is connected, is installed, the first measuring device 400 being connected to the second pipe 102. That is, the first measuring device 400 may measure the flow rate of the control gas 101 flowing into the valve 300, and the second measuring device 600 may measure the flow rate of the supply fluid 301 passing through the valve 300. In other words, the first measuring device 400 may be installed on the second pipe 102 connected to one valve 300, and the second measuring device 600 may be installed on the first pipe 302 on which the one valve 300 is installed.

In some embodiments, the second measuring device 600 may measure the flow rate of the supply fluid 301 by measuring the pressure of the supply fluid 301 flowing through the first pipe 302. In some embodiments, the second measuring device 600 may measure the flow rate of the supply fluid 301 by measuring the flow velocity of the supply fluid 301 flowing through the first pipe 302.

The controller 500 of the valve control device 10*d* may be connected to the flow rate controller 200. The controller 500 may adjust a target flow rate of the flow rate controller 200. In other words, the controller 500 may form a feedback signal for adjusting the target flow rate of the flow rate controller 200. That is, the flow rate controller 200 may receive the feedback signal and adjust the flow rate of the control gas 101.

In some embodiments, the controller 500 may receive a measurement value of the first measuring device 400. That is, the controller 500 may form a feedback signal based on the flow rate of the control gas 101 measured by the first measuring device 400.

Specifically, in the process of opening and closing the first pipe 302, a time delay zone may occur. For example, referring to FIGS. 2 and 3, a driving pressure range before the first pipe 302 is completely opened or closed is referred to as a time delay zone. When the pressure formed in the valve 300 in the process of controlling the supply of the supply fluid 301 corresponds to the time delay zone, the supply or blocking of the supply fluid 301 may not be smooth.

The controller 500 may measure the pressure of the control gas 101 in real time through the first measuring device 400 to control a target flow rate of the first measuring device 400. That is, the controller 500 may control a target flow rate of the control gas 101 of the flow rate controller 200 so that the pressure formed in the valve 300 does not correspond to the time delay zone.

In some embodiments, the controller 500 may receive a measured value of the first measuring device 400 and a measured value of the second measuring device 600. The controller 500 may adjust the target flow rate of the flow rate controller 200 based on the measured values of the first measuring device 400 and the measured values of the second measuring device 600.

Specifically, the controller 500 may form a feedback signal for controlling the target flow rate of the flow rate controller 200 based on the flow rate of the control gas 101 adjusting the valve 300 and the flow rate of the supply fluid 301 passing through the valve 300. In some embodiments, in the case of an NO type valve, as the flow rate of the supply fluid 301 increases, the controller 500 may form a feedback signal such that the flow rate of the control gas 101 increases.

In addition, the controller 500 may monitor the flow rate of the supply fluid 301 through the second measuring device 600 and determine whether the supply fluid 301 is supplied or blocked. Accordingly, the controller 500 may know in real time, through the flow rate of the supply fluid 301, whether the pressure formed in the valve 300 by the control gas 101 corresponds to the time delay zone. When the pressure formed in the valve 300 by the control gas 101 corresponds to the time delay zone, the controller 500 may adjust the target flow rate of the flow rate controller 200 so that the pressure formed in the valve 300 escapes the time delay zone.

In some embodiments, the flow rate of the supply fluid 301 passing through the valve 300 may vary in the process of changing manufacturing facilities. In the step of setting the flow rate of the control gas 101 according to a change in the flow rate of the supply fluid 301, the controller 500 may control an optimized flow rate of the control gas 101 to the target flow rate of the flow rate controller 200. That is, during a test process after changing the manufacturing facilities, the controller 500 may control the target flow rate of the flow controller 200 such that the pressure formed in the valve 300 does not correspond to the time delay zone, based on the measured value of the first measuring device 400 and the measured value of the second measuring device 600.

The valve control device 10*d* according to an embodiment may accurately control the supply of the supply fluid 301 through the controller 500 installed on the valve 300. The supply and blocking of the supply fluid 301 may be accurately performed, and thus, a high-quality substrate processing process may be performed.

Figure 8:
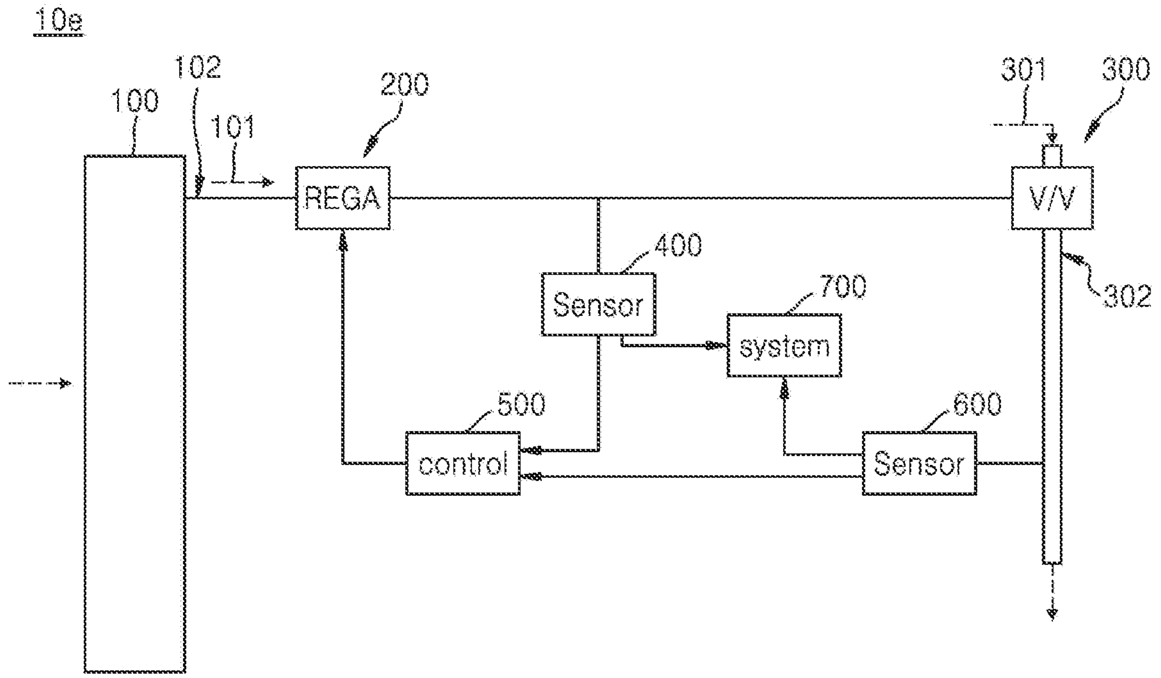
FIG. 8 is a conceptual diagram schematically illustrating a valve control device according to an embodiment.
Figure 9:
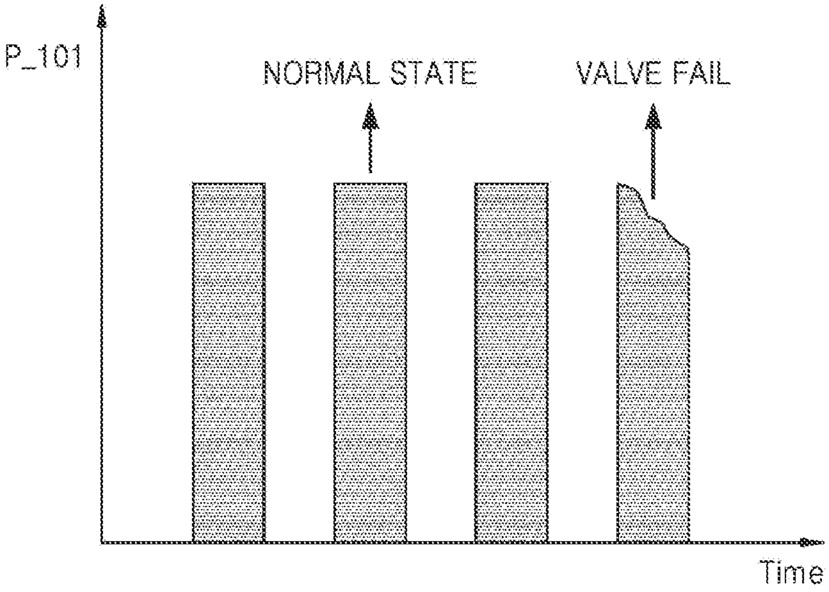
FIG. 9 is a graph showing a process of determining whether a valve is abnormal by a system of FIG. 8.

FIG. 8 is a conceptual diagram schematically illustrating a valve control device according to an embodiment. FIG. 9 is a graph showing a process of determining whether a valve is abnormal by a system of FIG. 8.

Referring to FIG. 8, a valve control device 10*e* may include a manifold 100, a plurality of valves 300, a plurality of flow rate controllers 200, a first measuring device 400, a second measuring device 600, a plurality of controllers 500, and a system 700.

Hereinafter, descriptions of the valve control device 10*e* that are redundant with those of the valve control device 10 of FIG. 1 will be omitted and differences will be described. A first system and a second system, which are described below, may be one system 700.

The first system of the valve control device 10*e* may be connected to the first measuring device 400. In some embodiments, the first system may receive, wirelessly or by wire, a measured value of the first measuring device 400. That is, the first system may receive in real time the flow rate of a control gas 101 flowing through a second pipe 102.

The first system may determine whether the valve 300 is abnormal based on the measured value of the first measuring device 400. That is, the first system may measure the flow rate of the control gas 101 and determine in real time whether the valve 300 is abnormal. Accordingly, it is possible to respond to the presence or absence of abnormalities in the valve 300.

In some embodiments, the plurality of valves 300 may include a fourth valve group. The fourth valve group may include valves connected to the second pipe 102 in which the first measuring device 400 is installed. The first system may determine whether the valves of the fourth valve group are abnormal.

Specifically, referring to FIG. 9, when the valve 300 fails, such as when the control gas 101 flowing into the valve 300 leaks, the pressure of the control gas 101 may not be constant. In the process of controlling the opening and closing of a first pipe 302, when the pressure of the control gas 101 is not constant, the first system may determine that the valve 300 is in an abnormal state. That is, the first system may monitor the flow rate (or pressure) of the control gas 101 in real time to determine whether the valve 300 is abnormal.

In some embodiments, the second system may receive the measured value of the first measuring device 400 and the measured value of the second measuring device 600 by wire or wirelessly. The second system may determine whether the valve 300 is abnormal based on the measured value of the first measuring device 400 and the measured value of the second measuring device 600. In addition, the second system may stop the process and transmit a signal to an operator when an abnormality is found in the valve 300.

In some embodiments, the plurality of valves 300 may include a fifth valve group. The fifth valve group may include valves installed on the first pipe 302 where the second measuring device 600 among the fourth valve group is located. The second system may determine whether the valves of the fifth valve group are abnormal.

Specifically, the second system may compare the pressure of the control gas 101 and the pressure of the supply fluid 301 with the value of a normal valve, and may determine that a measured valve 300 is in an abnormal state when a result of the comparison is greater than or equal to an error range. That is, the system 700 may store in advance a normal flow rate of the supply fluid 301 at a set flow rate of the control gas 101. Based on normal data stored in advance, whether the valve 300 is abnormal may be determined by comparing the flow rate of the control gas 101 and the flow rate of the supply fluid 301, monitored in real time.

The valve control device 10*e* according to an embodiment may determine in real time whether the valve 300 is abnormal based on the flow rate of the control gas 101 or the flow rate of the supply fluid 301 flowing into the valve 300 through the system 700. In some embodiments, the system 700 may be connected to each of the plurality of valves 300, and the valve control device 10*e* may determine whether each of the plurality of valves 300 is abnormal. Accordingly, the valve control device 10*e* may determine which valve among the plurality of valves 300 has a defect, and thus, time and cost for maintenance may be reduced.

Figure 10:
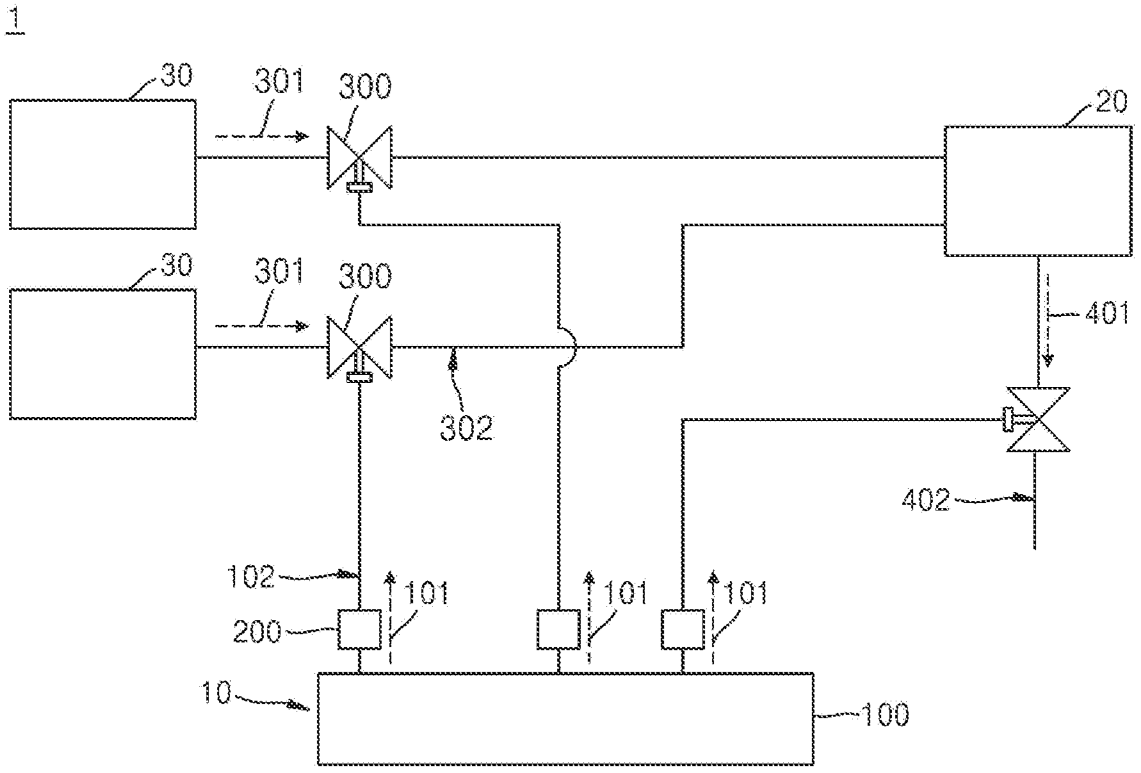
FIG. 10 is a conceptual diagram schematically illustrating a substrate processing apparatus according to an embodiment.

FIG. 10 is a conceptual diagram schematically illustrating a substrate processing apparatus according to an embodiment.

Referring to FIG. 10, a substrate processing apparatus 1 may include a chamber 20, a fluid supply 30, a first pipe 302, a third pipe 402, and a valve control device 10.

The chamber 20 of the substrate processing apparatus 1 may provide a processing space in which a substrate is processed. For example, the chamber 20 may have a cylindrical shape. The processing space may be sealed from the outside of the chamber 20 by the upper and side walls of the chamber 20.

Although not specifically illustrated and described, the chamber 20 may have an exhaust hole at a lower portion thereof. The exhaust hole may be connected to the third pipe 402 in which a pump is mounted. The exhaust hole may discharge, through the third pipe 402, reaction by-products generated during a substrate processing process and gas remaining inside the chamber 20 to the outside of the chamber 20. In this case, the pressure in the inner space of the chamber 20 may be reduced to a certain pressure.

The fluid supply 30 of the substrate processing apparatus 1 may supply the supply fluid 301 into the chamber 20. In other words, the fluid supply 30 may provide the supply fluid 301 into the processing space of the chamber 20. In some embodiments, the supply fluid 301 may be a supercritical fluid.

The first pipe 302 of the substrate processing apparatus 1 may connect the fluid supply 30 to the chamber 20. That is, the first pipe 302 may provide a path through which the supply fluid 301 flows from the fluid supply 30 to the chamber 20.

The third pipe 402 of the substrate processing apparatus 1 may be connected to the chamber 30. The third pipe 402 may discharge a residual fluid 401 inside the chamber 30 to the outside of the chamber 30. In other words, the third pipe 402 may provide a path for discharging the residual fluid 402 to the outside of the chamber 30 after the process is performed in the chamber 30. In some embodiments, the residual fluid 402 may be a supercritical fluid.

In some embodiments, the third pipe 402 may be a safe line through which a process fluid or a residual fluid is discharged when an abnormality such as a failure of the chamber 30 occurs.

The valve control device 10 of the substrate processing apparatus 1 may be connected to at least one of the first pipe 302 and the third pipe 402 to control opening and closing of an installed pipe.

The valve control device 10 may include a manifold 100, a plurality of valves 300, and a plurality of flow rate controllers 200. The manifold 100 may provide a control gas 101 for controlling the plurality of valves 300 and may include a plurality of second pipes 102.

The plurality of valves 300 may be connected to the plurality of second pipes 102. The plurality of valves 300 may be installed on at least one of the first pipe 302 and the third pipe 402 to open and close an installed pipe. That is, the plurality of valves 300 may control the supply of the supply fluid 301 and the discharge of the residual fluid 401. The plurality of valves 300 may include NO type valves or NC type valves.

In some embodiments, the plurality of valves 300 may be installed on the first pipe 302 to open and close the first pipe 302. In addition, the plurality of valves 300 may be installed on the first pipe 302 and the third pipe 402 to open and close the first pipe 302 or the third pipe 402, respectively.

In some embodiments, the substrate processing apparatus 1 may include a plurality of fluid supplies 30, and a plurality of first pipes 302 connecting each of the fluid supplies 30 to the chamber 20. The valve 300 may be installed on each of a plurality of first pipes 302 to individually open and close the plurality of first pipes 302.

The plurality of flow rate controllers 200 may be installed on the second pipes 102. The plurality of flow rate controllers 200 may adjust the flow rate of the control gas 101 flowing into the valve 300. Among the plurality of valves 300, all valves 300 connected to the same flow rate controller 200 may be of the same type. In some embodiments, the plurality of valves 300 and the plurality of flow rate controllers 200 may be connected to each other in a one-to-one correspondence. In some embodiments, valves 300 of the same type may be connected to one flow rate controller 200.

In some embodiments, the valve control device 10 may include the previously described valve control device 10 in FIG. 1, 10*a* in FIG. 4, 10*b* in FIG. 5, 10*c* in FIG. 6, 10*d* in FIG. 7, or 10*e* in FIG. 8.

Figure 11:
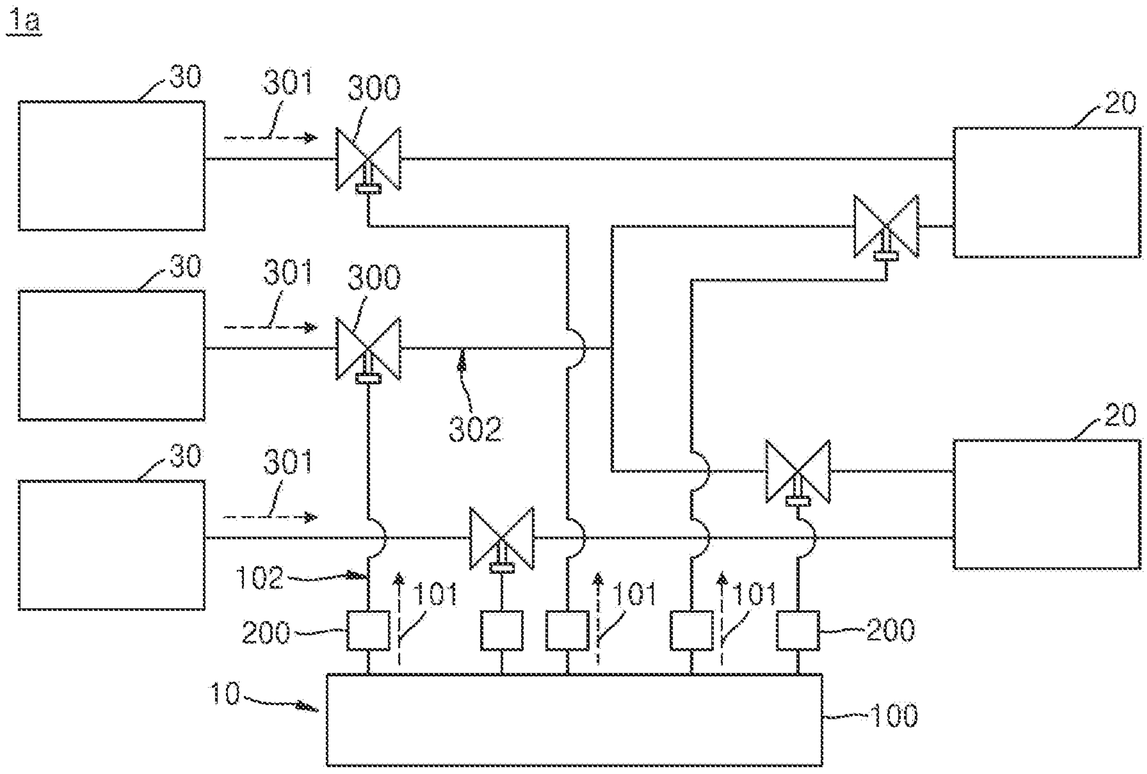
FIG. 11 is a conceptual diagram schematically illustrating a substrate processing apparatus according to an embodiment.

FIG. 11 is a conceptual diagram schematically illustrating a substrate processing apparatus according to an embodiment.

Referring to FIG. 11, a substrate processing apparatus 1*a* may include a plurality of chambers 20, a fluid supply 30, a first pipe 302, and a valve control device 10.

Each of the plurality of chambers 20 of the substrate processing apparatus 1*a* may provide a processing space in which a substrate is processed. For example, the chamber 20 may have a cylindrical shape. The processing space may be sealed from the outside of the chamber 20 by the upper and side walls of the chamber 20.

The fluid supply 30 of the substrate processing apparatus 1*a* may provide a supply fluid 301 into the plurality of chambers 20. In other words, the fluid supply 30 may provide the supply fluid 301 to the processing spaces of the plurality of chambers 20. In some embodiments, the supply fluid 301 may be a supercritical fluid.

The first pipe 302 of the substrate processing apparatus 1*a* may connect the fluid supply 30 to the chamber 20. That is, the first pipe 302 may provide a path through which the supply fluid 301 flows from the fluid supply 30 to the chamber 20.

The valve control device 10 of the substrate processing apparatus 1*a* may be connected to the first pipe 302 to control opening and closing of the first pipe 302.

The valve control device 10 may include a manifold 100, a plurality of valves 300, and a plurality of flow rate controllers 200. The manifold 100 may provide a control gas 101 for controlling the plurality of valves 300 and may include a plurality of second pipes 102.

The plurality of valves 300 may be connected to the plurality of second pipes 102. The plurality of valves 300 may be installed on the first pipe 302 to control opening and closing of the first pipe 302. That is, the plurality of valves 300 may control the supply of the supply fluid 301. The plurality of valves 300 may include NO type valves or NC type valves.

The plurality of flow rate controllers 200 may be installed in the second pipes 102. The plurality of flow rate controllers 200 may adjust the flow rate of the control gas 101 flowing into the valves 300. Among the plurality of valves 300, all valves 300 connected to the same flow rate controller 200 may be of the same type. In some embodiments, the plurality of valves 300 and the plurality of flow rate controllers 200 may be connected to each other in a one-to-one correspondence. In some embodiments, valves 300 of the same type may be connected to one flow rate controller 200.

In some embodiments, the valve control device 10 may include the previously described valve control device 10 in FIG. 1, 10*a* in FIG. 4, 10*b* in FIG. 5, 10*c* in FIG. 6, 10*d* in FIG. 7, or 10*e* in FIG. 8.

In some embodiments, the valve control device 10 may vary the flow rate of the control gas 101 flowing into each of the valves 300 according to the flow rate of the supply fluid 301 supplied to the chamber 20. The driving pressure of the valve 300 may be different for each flow rate of the supply fluid 301 supplied to each of the plurality of chambers 20. The valve control device 10 may differently adjust the flow rate of the control gas 101 of the valve 300 according to the flow rate of the supply fluid 301. That is, the valve control device 10 may adjust the flow rate of the control gas 101 to vary the pressure formed by the control gas 101 according to the driving pressure of each valve 300.

The substrate processing apparatus 1*a* according to an embodiment may provide different flow rates of the supply fluid 301 according to substrate processing processes performed in the plurality of chambers 20. In addition, even though the flow rates of the supply fluid 301 flowing into the plurality of chambers 20 are different from each other, the substrate processing apparatus 1 may supply an optimized flow rate of the control gas 101 to each of the plurality of valves 300 through the valve control device 10. Accordingly, the occurrence of damage or defects in the valves 300 of the substrate processing apparatus 1 due to the pressure generated when the first pipe 302 is opened or closed may be reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A valve control device comprising:

a plurality of valves respectively installed on a plurality of first pipes through which a supply fluid flows and configured to control opening and closing of the plurality of first pipes;

a manifold including a second pipe connected to each of the plurality of valves and supplying a control gas to the plurality of valves; and a flow rate controller installed on the second pipe and configured to adjust a flow rate of the control gas flowing through the second pipe, wherein the plurality of valves include at least one of a normal open (NO) type valve and a normal close (NC) type valve.

2. The valve control device of claim 1, wherein the flow rate controller has a one-to-one correspondence to the plurality of valves.

3. The valve control device of claim 1, wherein the plurality of valves include at least one NO type valve, the flow rate controller is installed on at least one of a plurality of second pipes, and among the plurality of second pipes, a second pipe on which the flow rate controller is installed is connected to the NO type valve.

4. The valve control device of claim 1, wherein the plurality of valves include a first valve group, the first valve group include NO type valves or NC type valves, and flow rates of the supply fluid flowing through the plurality of first pipes on which the first valve group is installed are a same.

5. The valve control device of claim 4, wherein the first valve group is connected to a pipe branched from one end of the second pipe.

6. The valve control device of claim 1, wherein the flow rate controller is installed on at least two second pipes, and the flow rate controller is further configured to adjust flow rates of a control gas flowing through the at least two second pipes, in which the flow rate controller is installed, to be different from each other.

7. The valve control device of claim 4, wherein the plurality of valves further include a second valve group including two or more NO type valves, and, as a flow rate of the supply fluid flowing through a plurality of first pipes on which the second valve group is installed increases, a flow rate of the control gas flowing through the second pipe connected to the second valve group increases.

8. The valve control device of claim 7, wherein the plurality of valves further include a third valve group including two or more NC type valves, and, as a flow rate of the supply fluid flowing through a plurality of first pipes on which the third valve group is installed increases, a flow rate of the control gas flowing through the second pipe connected to the third valve group decreases.

9. The valve control device of claim 1, wherein the plurality of valves include at least one NO type valve and at least one NC type valve, wherein a flow rate of the control gas flowing through the second pipe connected to the at least one NO type valve is a first flow rate, a flow rate of the control gas flowing through the second pipe connected to the at least one NC type valve is a second flow rate, and the first flow rate is less than the second flow rate.

10. The valve control device of claim 1, wherein the plurality of valves include a diaphragm valve.

11. A valve control device comprising:

a plurality of valves respectively installed on a plurality of first pipes through which a supply fluid flows and configured to control opening and closing of the plurality of first pipes;

a manifold including a plurality of second pipes respectively connected to the plurality of valves and supplying a control gas to the plurality of valves;

a flow rate controller installed on at least one of the second pipes and configured to adjust a flow rate of the control gas flowing through the installed second pipe;

a first measuring device including at least one first sensor installed on at least one of the second pipes and configured to measure a flow rate of the control gas flowing through the installed second pipe; and a controller connected to the flow rate controller and configured to adjust a target flow rate of the flow rate controller, wherein the plurality of valves include at least one of a normal open (NO) type valve and a normal close (NC) type valve.

12. The valve control device of claim 11, wherein the plurality of valves include a first valve group, and the first valve group includes a valve connected to a second pipe on which the first measuring device is installed.

13. The valve control device of claim 12, further comprising a first abnormality determination system configured to receive data from the first measuring device, wherein the first abnormality determination system is further configured to determine whether a valve included in the first valve group is abnormal.

14. The valve control device of claim 12, further comprising a second measuring device including at least one second sensor located in each of a plurality of first pipes on which the first valve group is installed, and configured to measure the flow rate of the supply fluid flowing through the plurality of first pipes.

15. The valve control device of claim 12, wherein the plurality of valves further include a second valve group, and the second valve group includes valves installed on the plurality of first pipes where a second measuring device is located.

16. The valve control device of claim 15, further comprising a second abnormality determination system configured to receive data from the first measuring device and the second measuring device, wherein the second abnormality determination system is further configured to determine whether a valve included in the second valve group is abnormal.

17. A substrate processing apparatus comprising:

a chamber;

a fluid supply configured to provide supercritical fluid into the chamber;

a first pipe connecting the fluid supply to the chamber to provide a path for the supercritical fluid;

a third pipe connected to the chamber to discharge the supercritical fluid to outside of the chamber; and a valve control device connected to at least one of the first pipe and the third pipe and configured to control opening and closing of at least one of the first pipe and the third pipe, wherein the valve control device includes:

a plurality of valves installed on at least one of the first pipe and the third pipe and configured to open and close at least one of the first pipe and the third pipe;

a manifold including a plurality of second pipes respectively connected to the plurality of valves and supplying a control gas to the plurality of valves; and a flow rate controller installed on at least one of the second pipes and configured to adjust a flow rate of the control gas flowing through the installed second pipe, and wherein the plurality of valves include at least one of a normal open (NO) type valve and a normal close (NC) type valve.

18. The substrate processing apparatus of claim 17, wherein the valve control device is configured to differently control the flow rate of the control gas according to a flow rate of the supercritical fluid supplied to the chamber.

19. The substrate processing apparatus of claim 17, wherein the plurality of valves include a first valve group, a second valve group, and a third valve group, wherein the first valve group includes NO type valves or NC type valves, the second valve group includes two or more NO type valves, the third valve group includes two or more NC type valves, and flow rates of the supercritical fluid passing through pipes on which the first valve group is installed are a same, wherein, as a flow rate of the supercritical fluid passing through a pipe in which the second valve group is installed increases, a flow rate of the control gas in the second pipes each connected to the second valve group increases, and as a flow rate of the supercritical fluid passing through a pipe in which the third valve group is installed increases, a flow rate of the control gas in the second pipes each connected to the third valve group decreases.

20. The substrate processing apparatus of claim 19, further comprising:

a first measuring device including at least one first sensor installed on at least one of the second pipes and configured to measure a flow rate of the control gas flowing through the installed second pipes;

a second measuring device including at least one second sensor located in the first pipe and configured to measure a flow rate of the supercritical fluid flowing through the first pipe;

a controller connected to the flow rate controller and configured to adjust a target flow rate of the flow rate controller; and a system configured to receive data from the first measuring device and the second measuring device, wherein the plurality of valves include a first valve group, the first valve group is connected to the second pipes on which the first measuring device is installed, and includes valves installed on the plurality of first pipes where the second measuring device is located, the controller is further configured to adjust a target flow rate of the flow rate controller installed on the second pipes connected to the first valve group, and the system is further configured to determines whether the first valve group is abnormal.

* * * * *